United States Patent [19]
Coll et al.

[11] Patent Number: 6,100,628
[45] Date of Patent: Aug. 8, 2000

[54] ELECTRON EMISSIVE FILM AND METHOD

[75] Inventors: Bernard F. Coll, Fountain Hills; Eric P. Menu, Mesa; Albert Alec Talin, Phoenix, all of Ariz.

[73] Assignee: Motorola, Inc., Schaumburg, Ill.

[21] Appl. No.: 09/322,304

[22] Filed: May 28, 1999

Related U.S. Application Data

[62] Division of application No. 08/720,512, Sep. 30, 1996.

[51] Int. Cl.$^7$ ...................................................... H01J 1/05
[52] U.S. Cl. ........................... 313/310; 313/309; 313/336; 313/351; 313/495
[58] Field of Search ..................................... 313/309, 310, 313/336, 351, 495

[56] References Cited

U.S. PATENT DOCUMENTS

| | | | |
|---|---|---|---|
| 5,279,723 | 1/1994 | Falabella et al. | 204/192.38 |
| 5,413,684 | 5/1995 | Bergmann | 204/298.41 |
| 5,458,754 | 10/1995 | Sathrum et al. | 204/192.38 |
| 5,536,193 | 7/1996 | Kumar | 445/24 |
| 5,804,909 | 9/1998 | Nilsson et al. | 313/309 |
| 5,848,925 | 12/1998 | Howard et al. | 313/306 |

FOREIGN PATENT DOCUMENTS

WO 94/12680  6/1994  WIPO .

*Primary Examiner*—Vip Patel
*Attorney, Agent, or Firm*—Kevin D. Wills

[57] ABSTRACT

A method for forming an electron emissive film (200, 730, 830) includes the steps of: (i) evaporating a graphite source (120, 620) in a cathodic arc deposition apparatus (100, 600) to create a carbon plasma (170, 670), (ii) applying a potential difference between the graphite source (120, 620) and a glass or silicon deposition substrate (130, 630, 710, 810) for accelerating the carbon plasma (170, 670) toward the deposition substrate (130, 630, 710, 810), (iii) providing a working gas within the cathodic arc deposition apparatus (100, 600), and (ii) depositing the carbon plasma (170, 670) onto the deposition substrate (130, 630, 710, 810).

5 Claims, 5 Drawing Sheets

ELECTRON EMISSIVE FILM AND METHOD

The present application is a divisional of prior U.S. application No. 08/720,512, filed on Sep. 30, 1996 which is hereby incorporated by reference, an priority thereto for common subject matter is hereby claimed.

FIELD OF THE INVENTION

The present invention pertains to an electron emissive material and more specifically to an electron emissive carbon film for use in field emission devices.

BACKGROUND OF THE INVENTION

Several materials are known in the art which are useful for providing electron emission in vacuum devices such as field emission devices. These prior art field emissive materials include metals such as molybdenum or semiconductors such as silicon. Because these materials require high electric fields, on the order of hundreds or thousands of volts per micrometer, emitter structures which include the emissive material are typically shaped to include, for example, sharp tips which function to locally increase the electric field and provide field strengths adequate to yield electron emission. Reasonable emission characteristics with stability and reproducibility necessary for practical applications have been demonstrated. However, the control voltage required for emission from these materials is relatively high (around 100 V). High voltage operation is undesirable for several reasons. For example, contaminant charged species discharged at the electron receiving material are accelerated to high velocities, thereby exacerbating damage caused by the bombardment by these species on elements of the device. Also, higher voltages require greater power consumption for a given current density. Another undesirable consequence of the use of these materials is that the fabrication of uniform sharp tips is difficult, tedious and expensive.

Also known in the art is the use of certain carbon-based materials to form electron emissive films. These include diamond, diamond-like carbon, and polycrystalline diamond films. These materials provide emission at low voltages so that the formation of field-enhancing, sharp-tipped geometries are therefore not required. This substantially simplifies the fabrication process of the emissive structure and substantially reduces costs. However, prior art carbon films have been plagued with unacceptably low emission site densities, on the order of tens or hundreds of sites per square centimeter. The low emission site density results in poor uniformity. Diamond does not emit electrons in a stable fashion due to its insulating nature; that is, the electrons which are emitted are not easily replaced due to the difficulty of providing a current path through the diamond. This results in a low density of emission sites in the film, resulting in a film which is unsuitable for use in applications such as field emission displays. Prior art methods for improving the electron emitting properties of diamond include doping the diamond to provide n-type or p-type semiconducting diamond. However, the n-type doping process has not been reliably achieved for diamond, and the p-type semiconducting diamond is not useful for low-voltage emission since it requires voltages in excess of 70 volts per micrometer to generate emission current densities on the order of 0.1 $mA/mm^2$. Other schemes for improving the conductivity of diamond films involve the formation of a high density of crystallographic defects within the film.

Electron emissive films have been formed by plasma enhanced chemical vapor deposition (PECVD). Amorphous carbon hydrogen-containing films (a-C:H) deposited by PECVD have been developed for field emission. These films have a low turn-on field within a range of about 15–30 V/micron. However, the emission site density of these films is low, on the order of tens of sites per square centimeter. Another undesirable characteristic of hydrogenated carbon films is that they exhibit poor temporal stability due to hydrogen out-diffusion.

The cathodic arc vapor deposition technique is primarily employed in the formation of coatings or films for use in tribological applications, such as the formation of wear-resistant coatings for cutting tools, bearings, gears, and the like. These wear-resistant coatings have been made from plasmas formed from titanium or graphite sources. When a titanium source material is used, a reactive gas such as nitrogen is often introduced into the deposition chamber during the vaporization of the titanium source. The nitrogen gas reacts with the titanium, and the coating plasma within the chamber comprises Ti, $N_2$ and TiN. The TiN forms a coating that has been found to be a very durable coating. A graphite source material is used to form diamond-like carbon (DLC) films, tetrahedral amorphous carbon (ta-C), and carbon nitrogen (C:N) films.

Prior art carbon films produced by cathodic arc vapor deposition techniques are used for tribological applications, such as the formation of extremely hard and resistive thin films. The carbon films are deposited on substrates typically made of metal and impart wear resistance to the metallic surface. The cathodic arc vapor deposition process has been modified to enhance and optimize the tribological properties of the films. In one scheme, a hydrogen free ta-C film is deposited by the evaporation of a graphite source by a filtered vacuum arc; the resulting microstructure is amorphous, having various ratios of $sp^3/sp^2$ hybridization of the carbon and forming unsegregated phases.

Also known in the art are a wide range of heat-treated carbons which are prepared by heating an organic precursor to temperatures in excess of about 1000° C. At these high temperatures some carbon precursors are known to graphitize. Within the temperatures of about 500–900° C., organic precursors tend to form chars; at about 1000° C. nitrogen and oxygen are evolved; and at about 1200° C. hydrogen is evolved. At sufficiently high temperatures, some carbons will begin to graphitize. Such high temperatures, however, exceed the temperature tolerances of glass, a material typically employed in the substrates of field emission displays.

There exists a need for an electron emissive film which emits electrons at low electric field strengths, is suitable for use in field emission devices, provides uniform electron emission and a high density of emission sites, and has a turn-on field of less than 30 V/$\mu$m. Additionally, there exists a need for a method for forming such a film which includes deposition temperatures that are compatible with the temperature constraints of glass substrates used in field emission devices.

BRIEF DESCRIPTION OF THE DRAWINGS

Referring to the drawings.

DESCRIPTION OF THE PREFERRED EMBODIMENT

EXAMPLE 1

Figure 1:
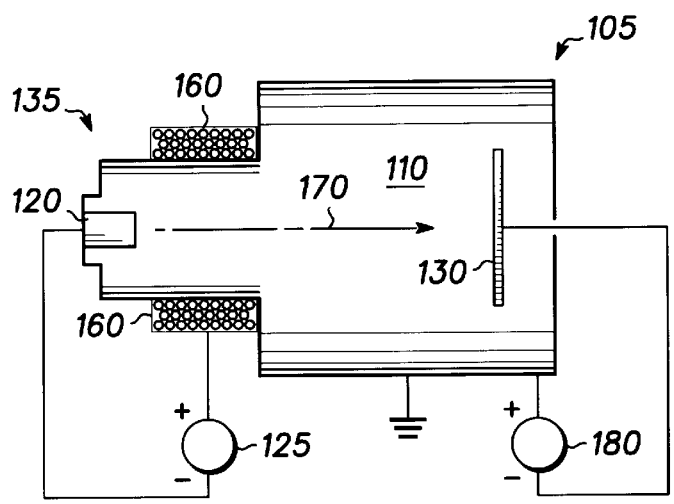
FIG. 1 is a schematic representation of a rectilinear cathodic arc deposition apparatus suitable for performing the steps of a method in accordance with the present invention.

Referring to FIG. 1, there is depicted a schematic representation of a rectilinear cathodic arc deposition apparatus 100 suitable for performing a method for forming an electron emissive film in accordance with the present invention. Apparatus 100 is configured and operated so as to produce electron emissive films which will yield a current on the order of microamps at low electric field strengths, less than about 30 V/$\mu$m, and which will exhibit a high surface electron emission site density, preferably greater than about $10^5$ electron emission sites per square centimeter, at typical electric field strengths encountered in field emission devices. Emission characteristics of films produced with apparatus 100 were tested in diode and triode field emission devices. A triode field emission device which was used to test emission, and demonstrate suitability of the film for use in a field emission device, is described in greater detail with reference to FIG. 7. Apparatus 100 includes an electric arc vapor deposition system. It is emphasized that FIG. 1 is only a diagrammatic representation of such a system which generally schematically illustrates those basic portions of an electric arc vapor deposition system that are relevant to a discussion of the present invention, and that such diagram is by no means complete in detail. For a more detailed description of electric arc vapor deposition systems and various portions thereof, one may refer to U.S. Pat. Nos. 3,393,179 to Sablev, et al., 4,485,759 to Brandolf, 4,448,799 to Bergman, et al., and 3,625,848 to Snaper. To the extent that such additional disclosure is necessary for an understanding of this invention, the disclosures and teachings of such patents are herein incorporated by reference. Apparatus 100 includes a vacuum chamber 105 defining an interspace region 110 which is evacuated to a pressure of about $10^{-6}$ Torr. A deposition substrate 130 is disposed within interspace region 110. Also within vacuum chamber 105 is disposed a graphite source 120. In this particular example, graphite source 120 included pure graphite, "Poco Graphite", which was obtained from Unocal and is a high-purity, nuclear grade graphite having a purity within a range of 99.999–100 mass per cent graphite. Other suitable solid sources of carbon will be apparent to one skilled in the art and may include, for example, a pressed carbon powder or a fullerene-containing powder. A deposition surface of substrate 130 is located along a line of sight from graphite source 120, at a distance of about 30 centimeters. Chamber 105 includes a duct portion 135 around which are wound copper coils to form a simple electromagnet 160 for providing a magnetic field within duct portion 135. The field strength used to deposit the electron emissive films was about 0.01 Tesla. It is believed that a suitable range of magnetic field strengths is within 0–0.1 Tesla. Other configurations of a means for applying a magnetic field will occur to those skilled in the art. A first voltage source 125 is operably coupled to graphite source 120 to provide the electric arc which operates on graphite source 120 to vaporize it and form a plasma. An electric arc is struck and maintained between graphite source 120, which is electrically biased to serve as a cathode, and an anode that is spaced apart from graphite source 120. An arc-initiating trigger element is positioned proximate graphite source 120 and is positively biased with respect to graphite source 120. The trigger element is momentarily allowed to engage the surface of graphite source 120, establishing a current flow path through the trigger and graphite source 120. As the trigger element is removed from engagement with the graphite source 120, an electrical arc is struck, which arc is thereafter maintained between the electrodes. The electric arc carries high electric current levels, typically ranging from 30 to several hundred amperes, and provides energy for vaporizing graphite source 120. Electric arc currents within the range of 25–150 amperes were used for the described configuration of apparatus 100. It is believed that a suitable range for the electric arc current for the configuration described, is about 25–300 amperes. The arc terminus is visible on the surface of graphite source 120, where the arc "touches" this cathode and is typically referred to as a "cathode spot". One or more of such cathode spots may exist on the surface at one time, depending upon the current present in the arc. The cathode spot(s) randomly move across the surface of graphite source 120, instantaneously vaporizing graphite source 120 into a coating plasma 170. Homogeneity of the film is improved by controlling the movement of the arc or cathode spot(s) over the surface of graphite source 120 by, as in the preferred embodiment of the present method, applying a magnetic field with electromagnet 160, as described in greater detail above. A suitable film may be formed in a similar manner while omitting the magnetic field generated by. electromagnet 160, the plasma species being directed toward substrate both by the potential difference between substrate 130 and graphite source 120, and by their thermal velocities, which are imparted by the vaporization process. The potential at substrate 130 is provided by operably coupling thereto a second potential source 180. Substrate 130 was held at a negative voltage within a range of 0 to −1000 volts. In the present example, a potential of −100 volts was utilized. Substrate 130 was not deliberately cooled or heated, but it was at an elevated temperature believed to be about 200 degrees Celsius due to radiation from the arcing at graphite source 120 and to the bombardment by the charged species of plasma 170. This substrate temperature is low enough to be compatible with substrate materials, such as soda lime glass, used in the cathode plates of field emission devices. Soda lime glass is particularly desirable because it is a low cost glass. However, it has lower temperature tolerances than most other common glasses. Such low temperature substrate materials are not compatible with the high temperatures, greater than about 1000° C., required by prior art, heat treatment methods for forming partially graphitized nanocrystalline carbons. However, in other embodiments of the present invention, the temperature of the substrate may be controlled, preferably within a range of 25–500° C., and most preferably within a range of 25–200° C. Film depositions in accordance with the present invention were performed on silicon and glass substrates, including soda lime glass and borosilicate glass. First, a thin film of aluminum and/or amorphous silicon was deposited on the surface of the substrate. Each aluminum layer was about 1000 angstroms thick; each amorphous silicon layer was about 2000 angstroms thick. When both layers were deposited on the cleaned surface, the aluminum layer was deposited first. In some of the aluminum-plus-amorphous silicon configurations, the amorphous silicon was annealed to make it more resistive. Then, the film surface was cleaned with argon at −1000 volts to remove oxides, water, and contaminants. Thereafter, the surface was subjected to carbon ion beam bombardment at −1000 volts, thereby creating an interface layer which promotes adherence of the subsequent carbon film and prevents peeling and cracking of the carbon film. The interface layer is about 50 angstroms thick. Other suitable interface layers will be apparent to those skilled in the art. For the deposition onto glass substrates, a radio frequency voltage source was operably coupled to the substrate to provide a negatively biased voltage thereto. The use of a radio frequency voltage source was preferred for use with non-conducting substrates. For conducting substrates, such as silicon, a DC bias or low frequency pulsed power source (up to 100 kHz) may be used. In the present example, wherein rectilinear cathodic arc deposition apparatus 100 was used as the deposition chamber, emissive films were deposited for various working gas conditions. In one instance, no working gas is used: after providing substrate 130 and graphite source 120 therein, apparatus 100 was evacuated by a turbomolecular pump (not shown) to a base pressure of $2.3 \times 10^{-7}$ Torr. Thereafter, potentials were established at substrate 130 and graphite source 120, the magnetic field turned on, and the deposition was performed without adding other gases to the system. Alternatively, in other depositions of electron emissive films, a working gas was introduced within interspace region 110. Suitable working gases include nitrogen, helium, xenon, and argon. The working gas was added to provide a total pressure within a range of 0.1–500 milliTorr, preferably 2–50 milliTorr. It is believed that helium and argon aid in stabilizing the plasma. Nitrogen is a reactive working gas, the function of which is described in greater detail with reference to FIG. 2. Films were grown to thicknesses within a range of 0.01–2 μm. The preferred range, for field emission, was within about 0.01–1 μm. The film growth rate was about 0.25 μm/min.

Figure 2:
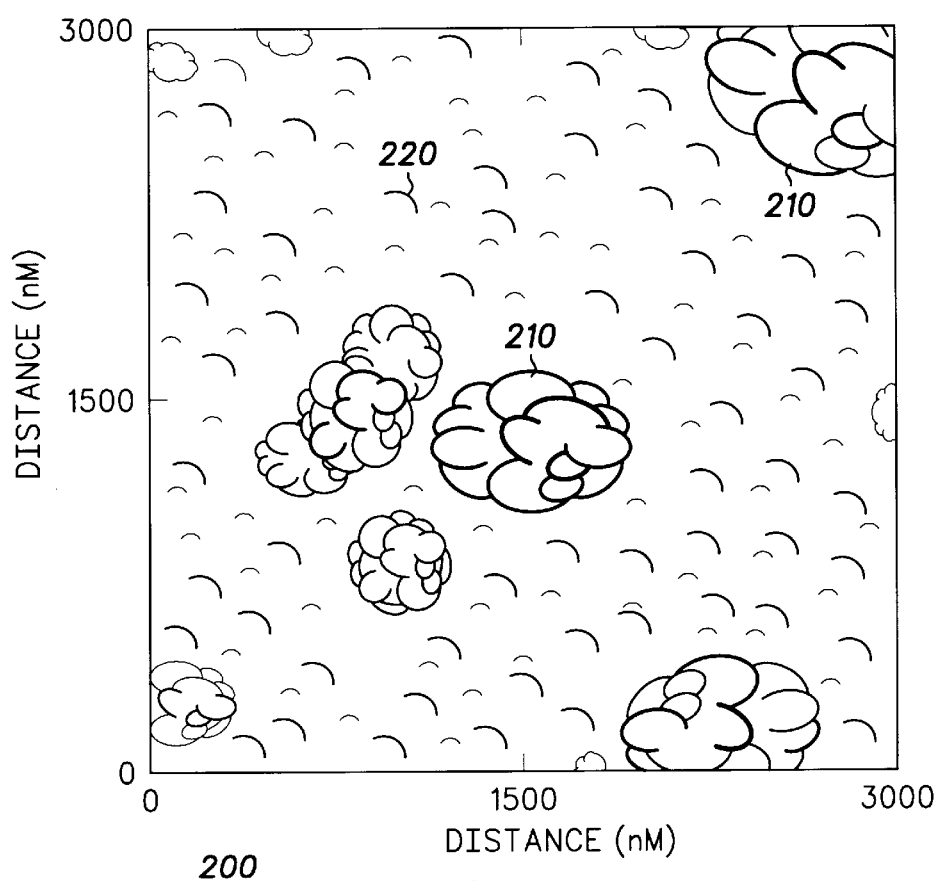
FIG. 2 is a plan view, atomic force microscopy (AFM) image; of the surface of an electron emissive film in accordance with the present invention.

Referring now to FIG. 2, there is depicted a representative drawing of a atomic force microscopy (AFM) image of the surface of an electron emissive film 200, which was produced by a method for forming an electron emissive film in accordance with the present invention. Electron emissive film 200 was deposited using apparatus 100 (FIG. 1) onto a silicon substrate having formed thereon, in the manner described with reference to FIG. 1, an aluminum thin film. No working gas was employed in this particular instance. The topology and microstructure of electron emissive film 200 are representative of the emissive films deposited by the present method in accordance with the present invention. The total surface roughness of electron emissive film 200 was less than or equal to about 500 nanometers, a plurality of larger particles 210 being embedded within a plurality of smaller particles 220, which comprise a subsurface layer having a rough surface including rounded humps of around 100–150 nm in size. An HRTEM image of electron emissive film 200 was also obtained and revealed that film 200 included may small grains around 15–20 nm in size. This image revealed a microstructure characteristic of partially graphitized nanocrystalline carbon material. Unlike ta-C films, electron emissive film 200 includes a nanocrystalline material having a hierarchical structures including small nanocrystalline carbon organized in nanoclusters which are organized in small bundles and submicronic particles. The partial graphitization is characterized by the presence of randomly oriented graphitic sheets including $sp^2$ carbon atoms, which form characteristic hexagonal atomic ring structures. A transmission electron microscopy (TEM) characterization of film 200 revealed the presence of lattice spacings within the range of 3.6–3.8 angstroms, which corresponds to the (002) plane of graphite; an electron energy loss spectroscopy (EELS) characterization of film 200 indicated a dominance of $SP^2$ bonding. The three-dimensional structures included within the partially graphitized carbon are believed to be derived from asymmetric atomic ring structures, each of which contains an odd number of atomic constituents. The formation of these asymmetric rings, including pentagonal and heptagonal rings, in the $sp^2$ hexagonal network results in the growth of the three-dimensional structures, which have characteristic dimensions on the order of 10 nanometers. The three-dimensional structures may include fullerene-like clusters or nanotubes. Graphitic nanoparticles have been described by D. Ugarte ("Graphitic Nanoparticles", *MRS Bulletin*, November 1994, which is hereby incorporated by reference), and carbon nanotubes have been described by Sumio Iijima ("Carbon Nanotubes", *MRS Bulletin*, November 1994, which is hereby incorporated by reference). The characteristics of the arc plasma stream of the present method results in the formation of this partially graphitized nanocrystalline material. The unfiltered, dense plasma includes a mixture of carbon ions, carbon atoms, carbon molecules (such as $C_{20}$, $C_{60}$, etc.), and, optionally, the atoms of a working gas, such as helium, argon, or nitrogen. The characteristics of the plasma which are believed to be responsible for controlling the nature of the nanocrystalline structures, include the identity of the working gas (if any), the extent of ionization of plasma species, the extent of clusterization of the carbon vapor, the ratio of ion flux to flux of neutral species at the deposition surface, and the velocity distribution of the carbon atoms at the deposition surface. By controlling these parameters, emissive structures can be manipulated toward fullerene-like (more spherical in shape), or nanotube-like (more tubular or elongated in shape). Also, the inclusion of a suitable reactive working gas, such as nitrogen, may promote the formation of 5-atom and 7-atom rings which have a tendency to form curved structures, rather than the planar sheets of 6-atom rings present in the graphitic regions. A film having a nitrogen composition of up to 30 atomic percent is suitable to produce an adequate composition of these three-dimensional structures for electron emission. These C:N films have nitrogen atoms substitutionally incorporated therein. This can be achieved by adding nitrogen as the working gas within apparatus 100 to a pressure within a range of 2–50 milliTorr. The use of nitrogen in a carbon arc deposition, for forming curved carbon structures, has been described by Sjostrom et al (Sjostrom H., Stafstrom S., Roman M. and Sundgren, J.-F, *Phys. Rev. Lett.*, 75, pp. 1336–1339 (1995), which is hereby incorporated by reference). Alternatively, a dopant may be introduced into chamber 105. Dopants may be useful for controlling the electronic structure (resistivity, carrier type, etc.) of the material and the density, dimensions, and shapes of the three-dimensional nanostructures of the film. Such dopants include transition metals, such as cobalt, iron, and nickel. Their precursors may be introduced as solids, admixed with the graphite of the source, or they may be introduced in the form of gaseous precursors. These metals act as catalysts for the formation of some of the unique nanocrystalline structures, such as nanotubes. Electron emissive film 200 may include one of several variants of partially graphitized carbon, such as turbostratic carbon, carbon black, carbon fibers, and carbon whiskers. Finally, because electron emissive film 200 does not include hydrogen, it is not expected to exhibit poor temporal stability due to hydrogen out-diffusion.

Figure 3:
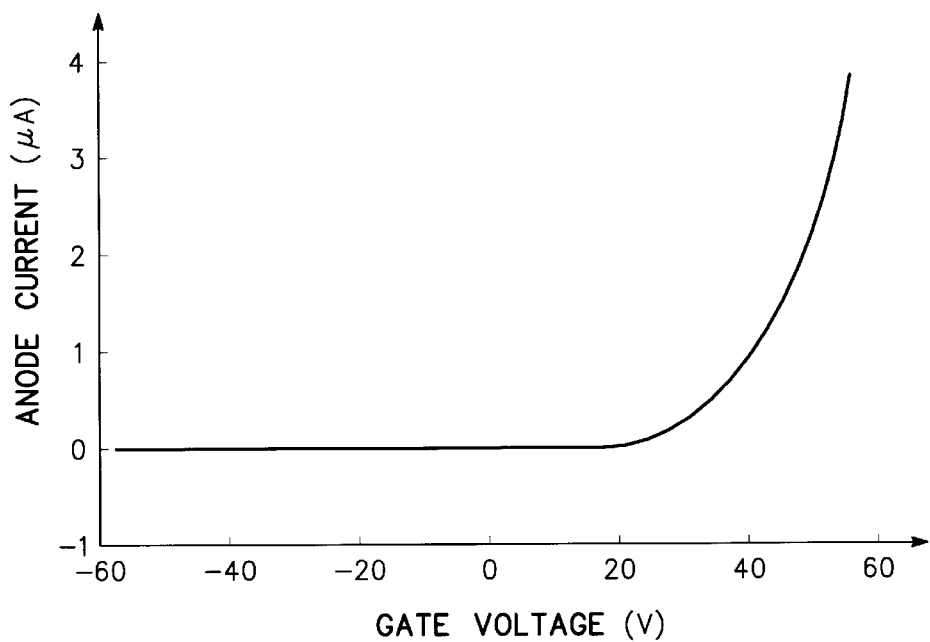
FIG. 3 is a graphical representation of electron emission versus voltage for the electron emissive film of FIG. 2.

Referring now to FIG. 3, there is depicted a graphical representation of electron emission versus voltage for electron emissive film 200. To obtain the graph of FIG. 3, electron emissive film 200 was tested for field emission in a triode field emission device, which will be described in greater detail below with reference to FIG. 3. The device included a single row of 128 pixels at a distance of 5 mm from the anode plate. The anode plate current was measured as the gate voltage was ramped, and, as illustrated in FIG. 3, the turn on voltage was about 20 Volts. Then, the single row was operated at an anode plate voltage of 4000 Volts and a gate voltage of 80 Volts. Under these conditions, the emission was very stable and uniform. Similar results were obtained when electron emissive film 200 was tested in a diode field emission device, in which the distance between the anode and cathode plates was about 0.3 mm. The diode substrate included a plain silicon wafer, and a circular deposit, having a 12 mm diameter, of emissive film 200 was deposited thereon using rectilinear cathodic arc deposition apparatus 100. The material was found to have a turn on field of less than 20 V/$\mu$m (to achieve microamps of current). At anode plate voltages of about 4000 Volts, the site density was very high, greater than $10^5$ sites per square centimeter, thereby demonstrating the suitability graphitic cathodic arc deposition techniques for use in the formation of electron emissive films in accordance with the present invention. The method employed for measuring density of surface emission sites is described in "Electron Field Emission from Amorphous Tetrahedrally Bonded Carbon Films" by A. A. Talin and T. E. Felter, *J. Vac. Sci. Technol*, A 14(3), May/June 1996, pp. 1719–1722, which is hereby incorporated by reference. The resolution of this technique is determined by the distance between the probe and substrate and by the radius of the probe. The spatial resolution of the configuration employed was about 20 micrometers per site. Measurements were made which revealed a minimum emission site density of $2.5 \times 10^5$ sites/cm$^2$. Cathodic arc deposition techniques have not heretofore been used to form uniform electron emissive carbon films. These results also demonstrate the suitability of partially graphitized nanocrystalline carbons for use in the formation of electron emissive films in accordance with the present invention.

Similar field emission diode tests, utilizing the diode configuration described above, were performed on ta-C films to compare field emission characteristics. It was demonstrated that ta-C films, deposited by a filtered arc (another arc deposition technique, described in greater detail with reference to FIG. 5) without using a nitrogen working gas, have very low emission site densities, on the order of 10/cm$^2$. They were also amorphous and had a turn-on field strength on the order of 15–30 V/micron. While the turn on fields of the ta-C films are suitable for use in field emission applications, their surface emission site density and uniformity are inadequate.

Figure 4:
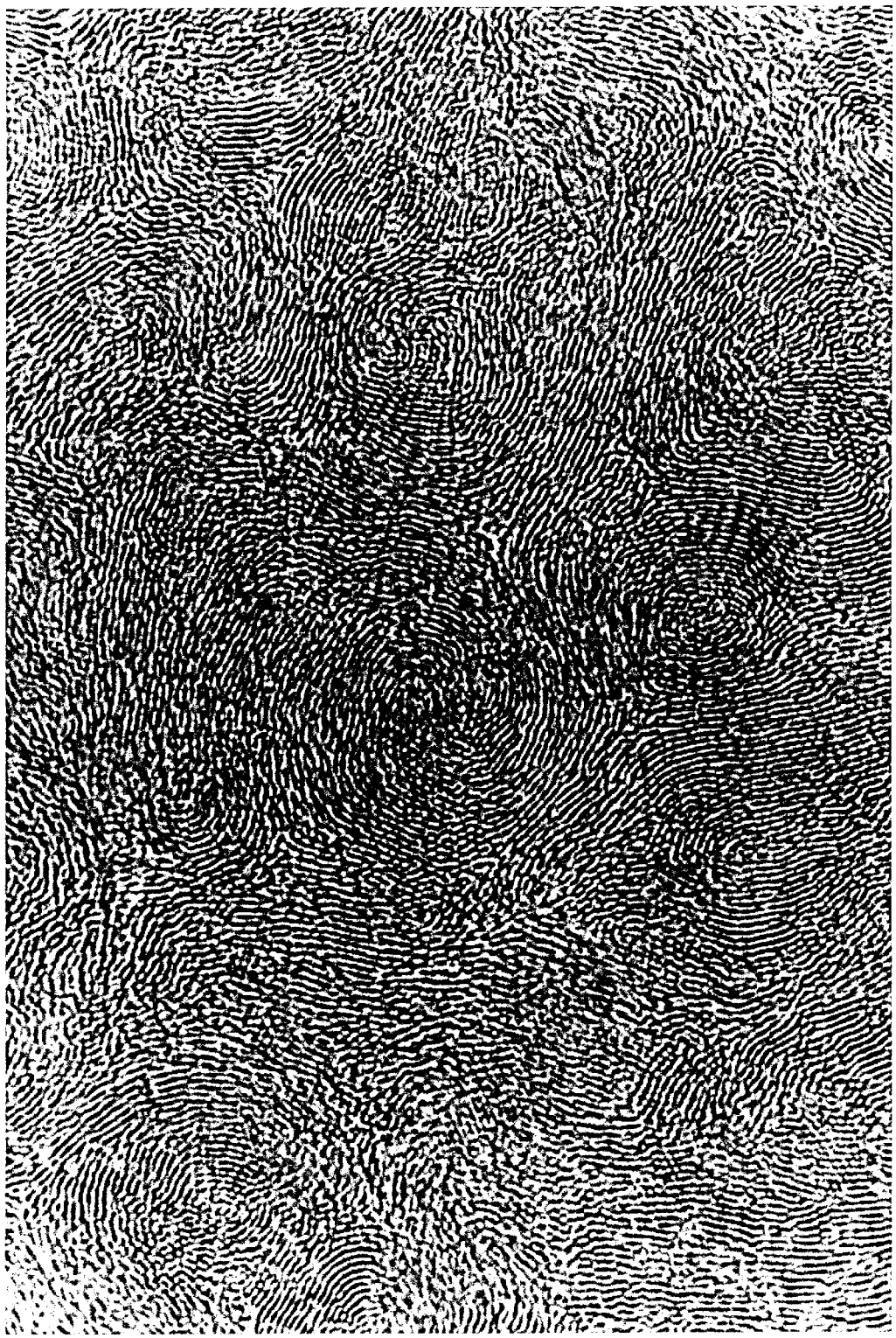
FIG. 4 is a plan view, high resolution transmission electron microscopy (HRTEM) image, of the surface of the electron emissive film of FIG. 2.

Referring now to FIG. 4, there is depicted a plan view HRTEM image of the surface of electron emissive film 200 (FIG. 2), magnified 650,000 times. The HRTEM image reveals regions having ordered carbon sheets. These ordered regions of parallel and concentric sheets comprise "thumbprint"-like configurations. These "thumbprint"-like regions appear to be randomly oriented with respect to one another.

Figure 5:
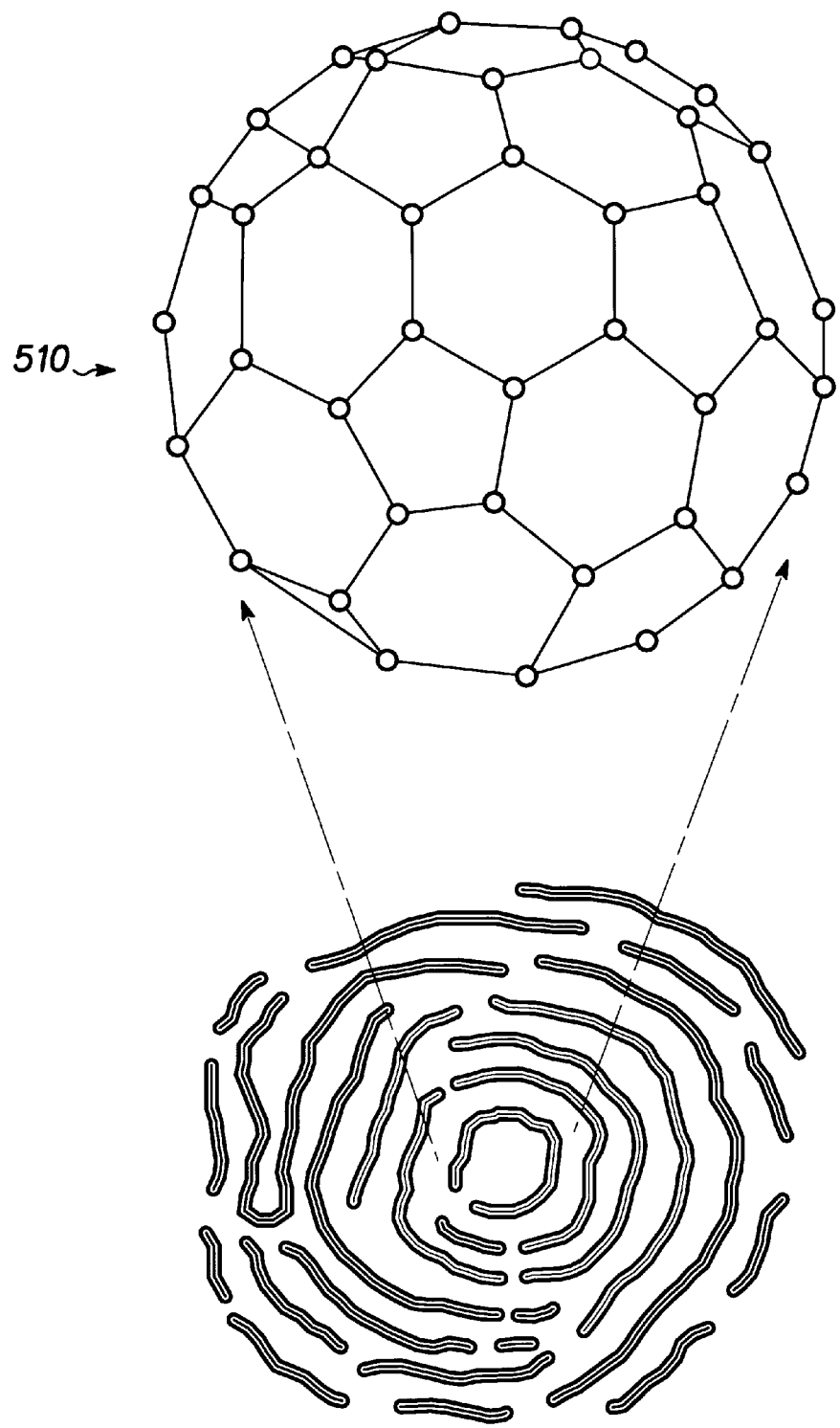
FIG. 5 is a plan view, HRTEM image, of a carbon nanostructure similar to those observed in the HRTEM image of FIG. 4.

Referring now to FIG. 5, there is depicted a plan view, HRTEM image, of an image of a carbon nanostructure 500 similar to those observed in the HRTEM image (FIG. 4) of electron emissive film 200. The actual diameter of carbon nanostructure 500 is on the order of 5–10 nanometers in length. The configuration of carbon structures which account for carbon nanostructure 500 is similar to the types of configurations present within emissive films formed by the present method in accordance with the present invention. A spherical carbon molecule 510, a fullerene, is present within carbon nanostructure 500 at its center. Surrounding spherical carbon molecule 510 are semi-cylindrical, parallel sheets of carbon. Similarly, the central portions of the observed "thumbprint" patterns of film 200 in the HRTEM image are surrounded by regions of parallel and concentric carbon sheets, thereby forming an onion-like configuration. These similarities suggest the presence of fullerene-like structures within the emissive film.

EXAMPLE 2

Figure 6:
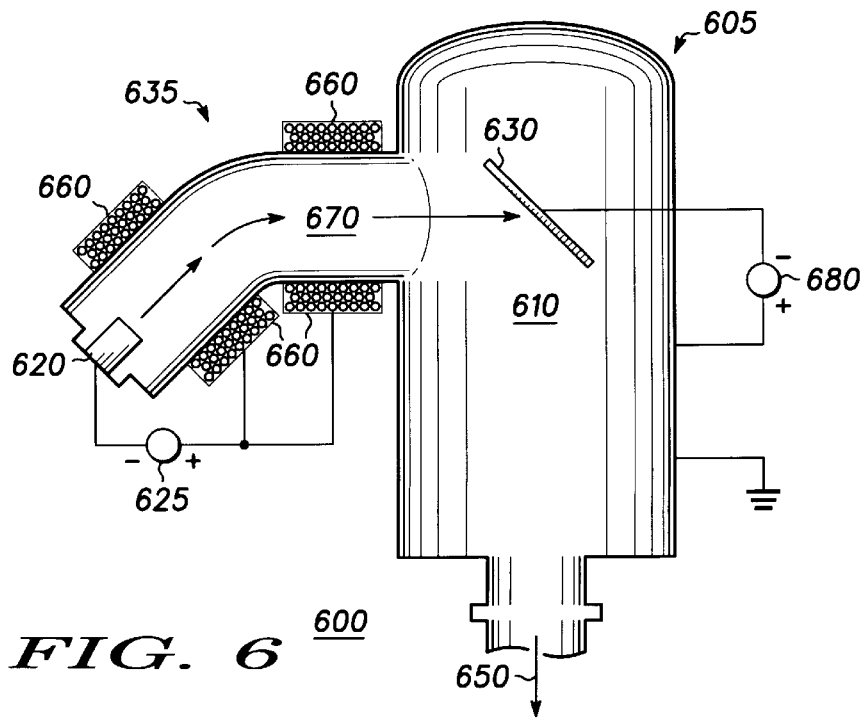
FIG. 6 is a schematic representation of a filtered cathodic arc deposition apparatus suitable for performing the steps of a method in accordance with the present invention.

Referring now to FIG. 6, there is depicted a schematic representation of a filtered cathodic arc deposition apparatus 600 suitable for performing the steps of a method for forming an electron emissive film in accordance with the present invention. Apparatus 600 is configured and operated so as to produce electron emissive films which will yield a current on the order of microamps at electric field strengths less than about 30 V/$\mu$m and which will exhibit a high surface electron emission site density, preferably greater than about $10^5$ sites per square centimeter, at electric field strengths typically used in field emission devices. Apparatus 600 includes an electric arc vapor deposition system. It is emphasized that FIG. 6 is only a diagrammatic representation of such a system which generally schematically illustrates those basic portions of a filtered electric arc vapor deposition system that are relevant to a discussion of the present invention, and that such diagram is by no means complete in detail. For a more detailed description of electric arc vapor deposition systems and various portions thereof, one may refer to U.S. Pat. Nos. 3,393,179 to Sablev, et al., 4,485,759 to Brandolf, 4,448,799 to Bergman, et al., and 3,625,848 to Snaper. To the extent that such additional disclosure is necessary for an understanding of this invention, the disclosures and teachings of such patents are herein incorporated by reference. Apparatus 600 includes a chamber 605 defining an interspace region 610. A deposition substrate 630 is disposed within interspace region 610. Also within chamber 605 is disposed a graphite source 620. In this particular example, graphite source 620 included pure graphite, "Poco Graphite", which was obtained from Unocal and is a high-purity, nuclear grade graphite having a purity within a range of 99.999–100 mass per cent graphite. Other suitable solid sources of carbon will be apparent to one skilled in the art and may include, for example, a pressed carbon powder or a fullerene-containing powder. A deposition surface of substrate 630 is located at the end of a bent duct portion 635 of chamber 605, and is disposed to receive plasma species emanating therefrom. The travel distance of the plasma species from graphite source 620 to substrate 630 was about 70 cm. An electromagnet 660 includes copper coils wound about bent duct portion 635 for providing a magnetic field therein. The field strength used to deposit the electron emissive films was about 0.01 Tesla. It is believed that a suitable range of magnetic field strengths is within 0–0.1 Tesla. Other configurations of a means for applying a magnetic field will occur to those skilled in the art. A first voltage source 625 is operably coupled to graphite source 620 to provide the electric arc which operates on graphite source 620 to vaporize it and form a plasma. An electric arc is struck and maintained between graphite source 620, which is electrically biased to serve as a cathode, and an anode that is spaced apart from graphite source 620. The formation and control of the arc are described with reference to FIG. 1. Electric arc currents within the range of 25–150 amperes were used. It is believed that a suitable range of electric arc current is within 25–300 amperes. Homogeneity of the film is improved by controlling the movement of the arc over the surface of graphite source 620 by applying a magnetic field with electromagnet 660. In the use of apparatus 600, the magnetic field is also necessary for directing the charged species around the bend of bent duct portion 635, which is also referred to as a "filter". The angle of the bend in apparatus 600 was 45°; other bend angles may be suitable for forming emissive films. The potential at substrate 630 is provided by operably coupling thereto a second potential source 680. Substrate 630 was held at a negative voltage within a range of 0 to –1000 volts, preferably –100 volts. Substrate 630 was water cooled to temperatures below about 100° C. These low substrate temperatures are low enough to be compatible with substrate materials, such as soda lime glass, which are desirable for use in cathode plates of field emission devices. Film depositions using apparatus 600 were performed on silicon and glass substrates. The glass substrates included soda lime glass and borosilicate glass. First, a thin film of aluminum and/or amorphous silicon was deposited on the surface of the substrate. Each aluminum layer was about 1000 angstroms thick; each amorphous silicon layer was about 2000 angstroms thick. When both layers were deposited on the cleaned surface, the aluminum layer was deposited first. In some of the aluminum-plus-amorphous silicon configurations, the amorphous silicon was annealed to make it more resistive. Then, the film surface was cleaned with argon at –1000 volts to remove oxides, water, and contaminants. Thereafter, the surface was subjected to carbon ion beam bombardment at –1000 volts, thereby creating an interface layer which promotes adherence of the subsequent carbon film and prevents peeling and cracking of the carbon film. The interface layer is about 50 angstroms thick. Other suitable interface layers will be apparent to those skilled in the art. For the deposition onto glass substrates, a radio frequency voltage source was operably coupled to the substrate to provide a negatively biased voltage thereto. The use of a radio frequency voltage source was preferred for use with non-conducting substrates. For conducting substrates, such as silicon, a DC bias or low frequency pulsed power source (up to 100 kHz) may be used. In the present example, wherein filtered cathodic arc deposition apparatus 600 was used for the deposition chamber, emissive films were deposited for various working gas conditions. After providing substrate 630 and graphite source 620 therein, apparatus 600 was evacuated by a turbomolecular pump (not shown), as indicated by arrow 650 in FIG. 6, to a base pressure of $2.3 \times 10^{-7}$ Torr. Potentials were established at substrate 630 and graphite source 620, and the magnetic field turned on, thereby generating a plasma 670 and guiding it toward substrate 630. A working gas, such as nitrogen, helium, or argon, was introduced within interspace region 610. The working gas was added to provide a total pressure within a range of 0.1–500 milliTorr, preferably 2–50 milliTorr. It is believed that helium and argon aid in stabilizing the plasma. Nitrogen is a reactive working gas, the function of which is described in greater detail with reference to FIG. 2. Films were grown to thicknesses within a range of 0.01–2 μm. The preferred range, for field emission, was within about 0.01–1 μm. The film growth rate was about 0.25 μm/min.

Other methods for forming a partially graphitized nanocrystalline carbon film for emitting electrons at low electric field strengths and providing a high density of emission sites, in accordance with the present invention, will be apparent to one skilled in the art. These methods may include laser ablation of graphite, mass selected carbon ion beam deposition, sputtering, and chemical vapor deposition.

Figure 7:
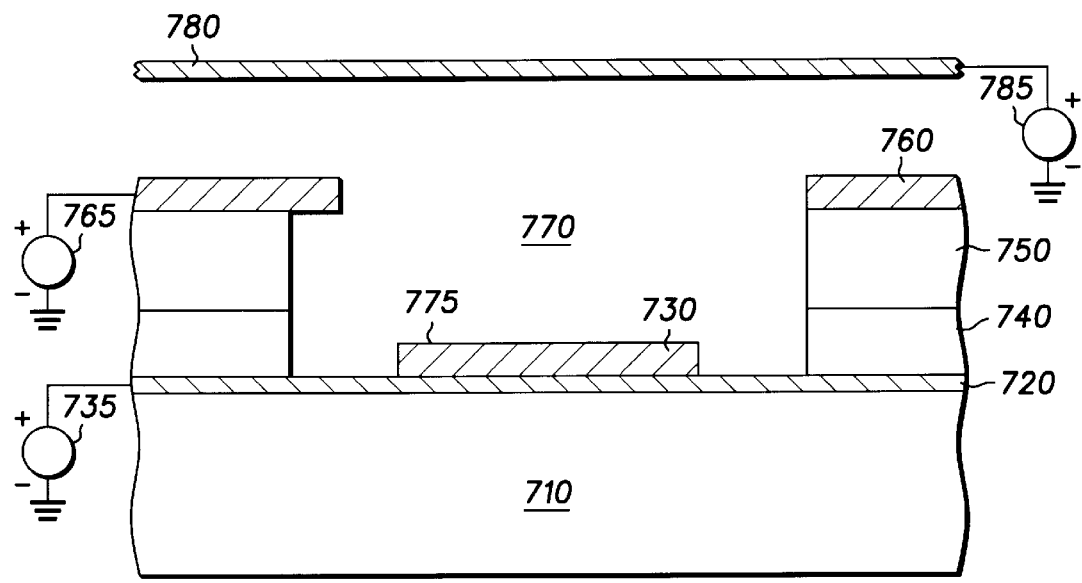
FIG. 7 is a cross-sectional view of an embodiment of a field emission device in accordance with the present invention.

Referring now to FIG. 7, there is depicted an embodiment of a field emission device 700 in accordance with the present invention. Field emission device 700 includes an electron emissive film 730 deposited and formed according to the method described with reference to FIGS. 1–5 in accordance with the present invention. It is desired to be understood that the use of the electron emissive film of the present invention is not to be limited to the structure depicted in FIG. 7. An electron emissive film, in accordance with the present invention, is useful in other configurations of field emission devices, including, for example, edge emission devices and devices having emitter structures that are coated with a field emissive film. Field emission device 700 is made by first providing a supporting substrate 710 made from a suitable material, such as glass or silicon. A conductive layer 720 is deposited by standard deposition techniques on supporting substrate 710. Then, a field shaper layer 740 is deposited on conductive layer 720. Layer 740 is made from a doped silicon. The dopant may include boron. Thereafter, a dielectric layer 750 is formed on layer 740. Dielectric layer 750 may be made from silicon dioxide. A gate extraction electrode layer 760, made from a suitable conductor such as molybdenum, is deposited onto layer 750. An emitter well 770 is formed by selectively etching into layers 760, 750, 740. Emitter well 770 has a diameter of about 4 μm and a depth of about 1 μm. The etched structure is then placed within a cathodic arc deposition apparatus, such as described with reference to the above examples. An electron emissive film 730 is deposited, in a manner described with reference to the above examples, on conductive layer 720 within emitter well 770. Electron emissive film 730 includes a film of partially graphitized nanocrystralline carbon, in accordance with the present invention. The thickness of electron emissive film 730 may be between 0.01–2 micrometers, preferably between 0.01–1 μm. A first voltage source 735 is operably coupled to conductive layer 720. A second voltage source 765 is operably coupled to gate extraction electrode layer 760. An anode 780 is provided and spaced from layer 760, and a third voltage source 785 is operably coupled thereto. The operation of field emission device 700 includes applying suitable potentials at electron emissive film 730, layer 760, and anode 780 for extracting electrons from an emissive surface 775 of electron emissive film 730 and causing them to traverse out of emitter well 770 toward anode 780. Layer 740 aides in shaping the electric field in the region of emissive surface 775 of electron emissive film 730. In other embodiments of a field emission device in accordance with the present invention, an electron emitter includes a structure, such as a Spindt tip cone, which is coated with an electron emissive film made from partially graphitized nanocrystalline carbon in accordance with the present invention. Other suitable electron emitter geometries will occur to one skilled in the art.

Figure 8:
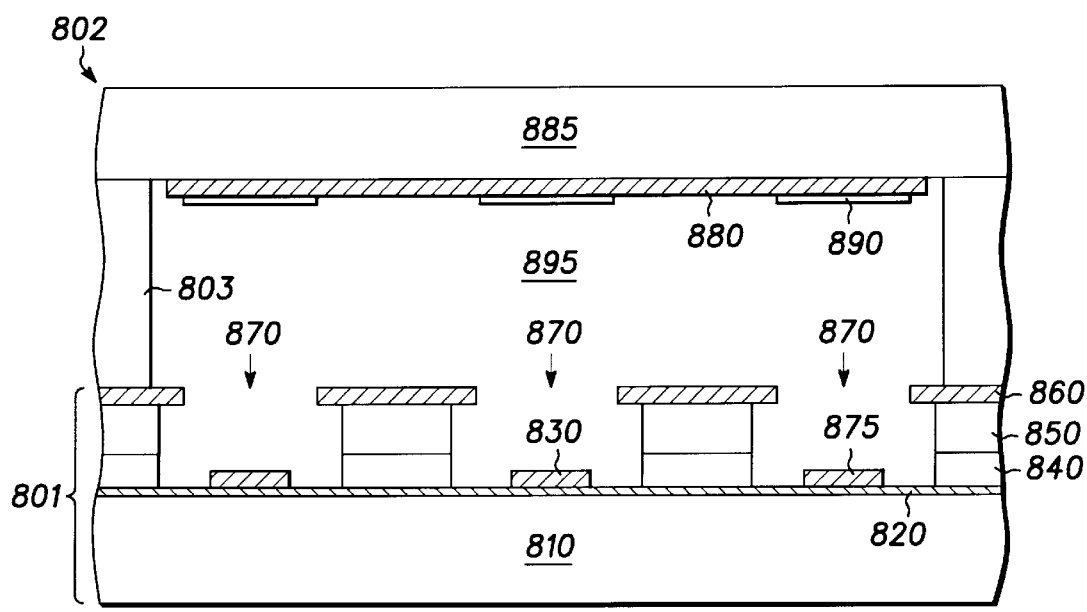
FIG. 8 is a cross-sectional view of an embodiment of a field emission display, including the field emission device of FIG. 7, in accordance with the present invention.

Referring now to FIG. 8, there is depicted an embodiment of a field emission display 800 in accordance with the present invention. Field emission display 800 includes a plurality of selectively addressable field emitters having the configuration of field emission device 700 (FIG. 7) and including an electron emissive film 830 in accordance with the present invention. It is desired to be understood that alternative configurations of a field emission device, having an electron emissive film in accordance with the present invention, may be included in a field emission display in accordance with the present invention. Field emission display 800 includes a cathode plate 801. Cathode plate. 801 is made by first providing a supporting substrate 810 made from a suitable material, such as glass or silicon. A conductive layer 820 is deposited by standard deposition techniques on supporting substrate 810 and patterned. Then, a field shaper layer 840 is deposited on conductive layer 820. Layer 840 is made from a doped silicon. The dopant may include boron. Thereafter, a dielectric layer 850 is formed on layer 840. Dielectric layer 850 may be made from silicon dioxide. A gate extraction electrode layer 860, made from a suitable conductor such as molybdenum, is deposited and patterned onto layer 850. A plurality of emitter wells 870 are formed by selectively etching into layers 860, 850, 840. Each emitter well 870 has a diameter of about 4 $\mu$m and a depth of about 1 $\mu$m. Layers 820 and 860 are patterned so that emitter wells 870 can be selectively addressed. The etched structure is then placed within a cathodic arc deposition apparatus, such as described with reference to the above examples. An electron emissive film 830 is deposited, in a manner described with reference to the above examples, on conductive layer 820 within emitter wells 870. Within each of emitter wells 870 is an electron emissive surface 875, defined by film 830. Electron emissive film 830 includes a film of partially graphitized nanocrystralline carbon, in accordance with the present invention. The thickness of electron emissive film 830 may be between 0.01–2micrometers, preferably between 0.01–1 $\mu$m. A suitable lithographic technique may be employed to remove those portions of film 830 which are on layer 860. An anode plate 802 is provided and spaced from gate extraction electrode layer 860. Anode plate 802 includes a glass substrate 885 upon which is deposited a transparent conductive layer 880, made from, for example, indium tin oxide (ITO). A plurality of cathodoluminescent deposits 890 are formed on layer 880. A frame 803 is provided between cathode plate 801 and anode plate 802, at their peripheries, to provide standoff therebetween and thereby define an interspace region 895. Interspace region 895 is evacuated to a pressure of about $10^{-6}$ Torr. The operation of field emission display 800 includes applying suitable potentials at conductive layer 820, layer 860, and layer 880 for extracting electrons from selectively addressed electron emissive surfaces 875 of electron emissive film 830 and causing the electrons to traverse out of the corresponding emitter wells 870, across interspace region 895, to be received by cathodoluminescent deposits 890, thereby causing them to emit light. A field emission display in accordance with the present invention is much simpler to fabricate than those of the prior art which include Spindt tips. Also, the drive circuitry required by a field emission display according to the present invention is cost effective since the turn on and operating voltages required by the novel carbon films are low. The current method also provides the advantage of not requiring sub-micron lithography, as is typical in the fabrication of Spindt tips.

While we have shown and described specific embodiments of the present invention, further modifications and improvements will occur to those skilled in the art. We desire it to be understood, therefore, that this invention is not limited to the particular forms shown, and we intend in the appended claims to cover all modifications that do not depart from the spirit and scope of this invention.

We claim:

1. A field emission device comprising:

a supporting substrate having a major surface;

an electron emitter disposed on the major surface of the supporting substrate and including an electron emissive film made from partially graphitized nanocrystalline carbon, the electron emitter having an emissive surface and being operably coupled to a first voltage source; and an anode spaced from the electron emitter to define an interspace region between the electron emitter and the anode, the anode being operably coupled to a second voltage source whereby the first and second voltage sources provide a suitable electric field between the electron emitter and the anode to cause electrons emitted by the electron emitter to traverse the interspace region and be received by the anode.

2. A field emission device as claimed in claim 1 wherein the electron emissive film has a thickness within a range of 0.01–2 micrometers.

3. A field emission device as claimed in claim 1 wherein the supporting substrate is made from glass.

4. A field emission device as claimed in claim 1 further including a dielectric layer having a major surface and defining an emitter well and being disposed on the major surface of the supporting substrate, the emissive surface of the electron emitter being disposed within the emitter well, the field emission device further including a gate electrode disposed on the major surface of the dielectric layer and peripherally disposed about the electron emitter.

5. A field emission display comprising:

an anode plate having a major surface including a conductive layer disposed thereon and a plurality of cathodoluminescent deposits formed on the conductive layer;

a cathode plate having a major surface including a plurality of selectively addressable field emitters having a electron emissive film made from partially graphitized nanocrystalline carbon; and a frame disposed between the anode plate and the cathode plate to define an interspace region therebetween having a pressure of about $10^{-6}$ Torr.

* * * * *